United States Patent [19]

Takasu et al.

[11] Patent Number: 4,910,156
[45] Date of Patent: Mar. 20, 1990

[54] NEUTRON TRANSMUTATION DOPING OF A SILICON WAFER

[75] Inventors: Shin'ichiro Takasu, Tokyo; Michihiro Ohwa, Kunitachi; Kazuhiko Kashima, Yokohama; Eiichi Toji, Machida; Kazumoto Homma, Sagamihara, all of Japan

[73] Assignee: Toshiba Ceramics Co., Ltd., Tokyo, Japan

[21] Appl. No.: 136,851

[22] Filed: Dec. 22, 1987

Related U.S. Application Data

[62] Division of Ser. No. 42,954, Apr. 27, 1987, abandoned.

[30] Foreign Application Priority Data

Apr. 30, 1986 [JP] Japan ................... 61-10552
Apr. 30, 1986 [JP] Japan ................... 61-10553
Dec. 3, 1986 [JP] Japan ................... 61-288372

[51] Int. Cl.$^4$ ............... H01L 21/00; H01L 21/02; H01L 21/26; H01L 21/263
[52] U.S. Cl. ........................ 437/17; 437/16; 437/15; 357/91; 148/DIG. 165; 376/158; 376/183; 376/156
[58] Field of Search .......... 148/DIG. 165; 376/183; 437/17

[56] References Cited

U.S. PATENT DOCUMENTS

| | | | |
|---|---|---|---|
| 3,967,982 | 7/1976 | Arndt et al. | 437/17 |
| 4,027,051 | 5/1977 | Reuschel et al. | |
| 4,129,463 | 12/1978 | Cleland et al. | |
| 4,137,099 | 1/1979 | Sun | |
| 4,234,355 | 11/1980 | Meinders | |
| 4,240,844 | 12/1980 | Felice et al. | |
| 4,260,448 | 4/1981 | Herzer | 376/183 |
| 4,277,307 | 7/1981 | Voss | 376/183 |
| 4,469,527 | 9/1984 | Sugano et al. | 437/17 |
| 4,684,413 | 8/1987 | Goodman et al. | |
| 4,712,057 | 12/1987 | Pau | |

FOREIGN PATENT DOCUMENTS

| | | | |
|---|---|---|---|
| 2617320 | 3/1977 | Fed. Rep. of Germany | 148/DIG. 165 |
| 2753488 | 7/1979 | Fed. Rep. of Germany | 437/17 |
| 0105965 | 9/1978 | Japan | 437/17 |

OTHER PUBLICATIONS

Guldberg, J., Electron Traps in Silicon Doped by Neutron Transmutation, J. Phip. D.: Appl. Phys., vol. 11, 1978, pp. 2043-2057.
Prussin, S., Application of Neutron Transmutation Doping for Production of Homogeneous Epitaxial Layers, J. Electrochem. Soc., Feb. 1978, pp. 350-352.
Cleland, J., Electrical Property Studies of Neutron Transmutation Doped Silicon, Neutron Transmut. Doping in Semiconductors, 1979, pp. 261-279.
Glairon, P., Isochron. Annealing of Resistivity in Float Zone and Czochralski NTD Silicon, Neut. Transmut. Dop. in Semicon., 1979, pp. 291-305.
Ghandhi, S., VLSI Fabrication Principles, 1983, Chapter 3.
Wolf, S., Silicon Processing for the VLSI ERA, 1986, Chapter 1.

Primary Examiner—Brian E. Hearn
Assistant Examiner—B. Everhart
Attorney, Agent, or Firm—Nixon & Vanderhye

[57] ABSTRACT

A silicon wafer and a method of producing a silicon wafer comprising a phosphor-doping method of doping phosphor into a single silicon crystals by transmuting isotope $Si^{30}$ contained in said single silicon crystals made by the CZ method or the MCZ method into $p^{31}$ under neutron irradiation to said single silicon crystals.

2 Claims, 8 Drawing Sheets

NEUTRON TRANSMUTATION DOPING OF A SILICON WAFER

This is a division of application Ser. No. 042,954, filed Apr. 27, 1987, now abandoned.

FIELD OF THE INVENTION

This invention concerns a method of adding (doping) phosphor to an oxygen-containing silicon wafer by neutron irradiation, a silicon wafer for use in epitaxial growing, a method of producing the wafer, a silicon wafer applied with neutron irradiation for doping phosphor and a selection device therefor.

BACKGROUND AND SUMMARY OF THE INVENTION

As a method of producing phosphor (P)-doped single silicon crystals having high resistivity of greater than 10 $\Omega$·cm, there is a FZ-NTD method (floating zone - neutron transmutation doping). This method is carried out by irradiating neutrons generated from nuclear reactions to single silicon crystals which are grown through the FZ method (floating zone method), in order to transmute isotopes $Si^{30}$ usually contained by about 3.10% in the single silicon crystals into $Si^{31}$ and, then they are transmuted to $P^{31}$, to thereby uniformly dope phosphor to the silicon single crystals. Since the single silicon crystals gown through the FZ method have an oxygen content (oxygen content according to the measuring standards specified by ASTM, 1981 edition: here and hereinafter) of below $5 \times 10^{16}$ atoms/cm$^3$, they can be used in the production steps of devices such as substrates for use in high voltage withstand power transistors, substrates for use in rectifiers, thyristors, etc., by applying heat treatment after the neutron irradiation, irrespective of the quality of neutron fluxes used for the irradiation, that is, the thermal neutron/fast neutron ratio.

Upon neutron irradiation, only the thermal neutrons contribute to the conversion of $Si^{30}$ into $P^{31}$. Fast neutrons having higher energy than thermal neutrons impinge against silicon atoms hat constitute a crystal thereby scattering the silicon atoms from the crystal position, stop after flying over a distance dependent on the initial energy and the property of the crystals to be irradiated, while losing the energy in the form of interstitial silicon atoms, whereby lattice defects corresponding to the amount of the fast neutrons are caused. If the single silicon crystals contain oxygen and if the interstitial silicon as the scattered interstitial atom and the interstitial oxygen are brought closer, binding is formed between them to possibly result in a lattice decect, that is, a A center defect. The A center defect is rapidly recovered by the heat treatment, by which the electric resistivity and the carrier life time are settled by the heating at 800° C. to 1000° C. in the case of single silicon crystals by the usual FZ-NTD method.

However, it is difficult and expensive, if possible, to obtain single silicon crystals of not less than 125 mm$\phi$ by the FZ method. As a method of overcoming this problem it has been tried to grow single silicon crystals of a relatively large diameter and low oxygen content by way of a T-MCZ (Czochralski method applying transversal magnetic field) and apply NTD (neutron transmuting doping) to the single silicon crystals obtained by the T-MCZ method.

In the case of applying the NTD process to the single silicon crystals grown by the T-MCZ method under certain conditions, as compared with the case of applying the NTD Process to the single silicon crystals grown by the FZ method, there is a first problem that although electric resistivity and the carrier life time are settled by applying heat treatment at 800° C. to 1000° C. to the single silicon crystals after the completion of NTD process, etched pits of not less than $10^3$/cm$^3$ are formed on the device in the subsequent device production step, a considerable leak current is present or current amplifying factor is reduced with respect to the NBS standard test device.

Further, since the single silicon crystals obtained by the T-MCZ method contain a greater amount of oxygen as compared with the single silicon crystals obtained by the FZ method although smaller as compared with the single silicon crystals obtained by he usual CZ method and, accordingly, A center defects are liable to be caused as compared with the FZ method. The A center defects are of course recovered by the heat treatment in the same manner as in the case of the single silicon crystals obtained by the FZ-NTD method.

In the NTD-applied single silicon crystals, since the electric resistivity and the carrier life time are recovered by the heat treatment under heating at a temperature from 800 to 1000° C. or higher, it is supposed that the A center defects are also recovered. However, it is not actually confirmed whether the A center defects are actually recovered or not. Accordingly, there is a second problem that if characteristics of the single silicon crystals applied with the NTD process should vary, it is not possible to select those silicon wafers having favorable characteristics and not all of the silicon wafers have desired characteristics.

While on the other hand, as the application field where the silicon wafers for use in epitaxial growing are used is extended along with the enhancement for the performance of bipolar devices, MOS devices, as well a power devices, reduction in the crystal defects of silicon wafers has strongly been demanded. In view of the above, development in the production techniques for the silicon wafers has been progressed in which generation of crystal defects due to contaminations is coped with cleaning for the production circumstances, automation for the wafer handling device, use of highly pure chemicals etc., while crystal defects caused by fabrication defects generated in the wafer fabrication are coped with the improvement for the fabrication technics in addition to the abovementioned countermeasures. However, none of the countermeasures is quite sufficient and satisfactory.

In order to compensate the foregoing insufficient countermeasures, it is necessary to control the concentration of oxygen incorporated into a silicon wafer. For this purpose, the amount of oxygen intruding from a quartz crucible used in a single crystal pulling-up device into single crystals is severely controlled, and intrinsic gettering or wafer inside gettering (hereinafter simply referred to as IG), extrinsic gettering or wafer rearface gettering (hereinafter simply referred to as EG) or the combination of them is selected for use depending on the amount of oxygen generated and intruded into the silicon wafer in an additional heat treatment before the epitaxial growing step and heat treatment during the epitaxial growing step.

The term IG means herein the local fixation of impurities related to the amount of saturated oxygen in the silicon wafer determined by the heating temperature for the silicon wafer and the amount of deposited nuclei determined by the thermal hysteresis after the crystallization. Further, the term EG means the local fixation of impurities due to mechanical injuries, fine silicon polycrystals o fine $Si_3N_4$ polycrystals applied under control to the surface of a silicon wafer on the side opposite to that applied with epitaxial growing (hereinafter referred to as a rearface).

The IG-gettering property is not favorable for silicon wafers with less oxygen deposition amount therein. However, if the amount o oxygen is increased excessively with an aim of enhancing the IG-gettering property, there is a problem that slips or the likes occur due to the deposition products upon heat treatment for the wafers. Then, since the application of IG is inadequate in the case of silicon wafers with the oxygen content of less than about $10 \times 10^{17}$ atoms/cm$^3$, EG is used in the case of such silicon wafers.

However, since a method of intruding fine powder of $SiO_2$, SiC, $Al_2O_3$, etc. into a high speed gas stream or high speed water stream and then blowing them to the rear face of a silicon wafer, or a method of rubbing the rear face of a silicon wafer with a brush comprising fine fibers made of organic material in admixture with the fine powder is used in the case of EG such as the mechanical rear face injuring method, for instance, there is a problem that it is extremely difficult to keep the cleanness at the rear face of the silicon wafer.

Accordingly, there is a third problem that application of EG as well as IG to silicon wafers with the oxygen content of lower than $10 \times 10^{17}$ atoms/cm$^3$ are inadequate.

Accordingly, a first object of this invention is to obtain conditions for the neutron irradiation dose capable of decreasing leak current upon doping P by way of neutron irradiation to single silicon crystals with low oxygen content manufactured by the CZ or MCZ method for overcoming the first problem described above.

A second object of this invention is to provide a silicon wafer with less relative leak current after heat treatment, and a device for selecting silicon wafers with less relative leak current after heat treatment, in order to overcome the foregoing second problem.

A third object of this invention is to provide a silicon wafer that can be applied with IG and a method of manufacturing a silicon wafer that can be applied with IG for overcoming the foregoing third problem.

The first object of this invention can be attained in a method of producing a P-doped silicon wafer comprising the steps of preparing a single silicon crystal by the MCZ method and having an oxygen content within a range from $5 \times 10^{16}$ atoms/cm$^3$ to $10 \times 10^{17}$ atoms/cm$^3$, and doping phosphor into said crystal by transmuting isotope $Si^{30}$ contained in said crystal into $P^{31}$, under a neutron irradiation to said crystal at, in an irradiation dose of fast neutrons less than $3 \times 10^{16}$/cm$^2$.

The second object of this invention is attained in a silicon wafer mad of a P-doped single silicon crystals made by transmuting Si under neutron irradiation, in. which said silicon wafer has a transmission intensity of not less than 30%, said transmission intensity being based on near infrared ray with a wavelength of 1.0 $\mu$m to 1.4 $\mu$m, as well as in a silicon wafer selecting device comprising a silicon wafer made of a P-doped single silicon crystals made by transmuting Si under neutron irradiation, an optical source for irradiating near infrared ray with a wavelength of 1.0 $\mu$m to 1.4 $\mu$m to said silicon wafer, and measuring means for measuring a transmission intensity of said near infrared ray transmitting said silicon wafer.

The third object of this invention is attained in another type of a silicon wafer for use in epitaxial growing, in which fast neutrons are irradiated at a dose of not less than $1 \times 10^{12}$/cm$^2$, as well as another method of producing silicon wafer having a low density of A center type defects for use in epitaxial growing comprising the steps of preparing a silicon wafer having an oxygen content of not less than $5 \times 10^{16}$ atoms/cm$^3$, and irradiating fast neutrons to said silicon wafer at a dose of not less than $1 \times 10^{12}$/cm$^2$ by a nuclear reactor having a thermal neutron/fast neutron ratio of not greater than 30.

The method of manufacturing a silicon wafer according to this invention can provide conditions for neutron irradiation dose capable of reducing the leak current upon doping P by way of neutron irradiations to single silicon crystals of a low oxygen content prepared by the CZ or MCZ method.

The silicon wafer according to this invention can provide a silicon wafer with less relative leak current after heat treatment and, in addition, the silicon wafer selection device according to this invention can select the silicon wafers with less relative leak current after heat treatment.

Another silicon wafer according to this invention can improve the IG-gettering property since the number of laminate defects induced by fabrication of silicon wafers can be decreased as compared with the case of not irradiating fast neutrons and, in addition, another method of manufacturing a silicon wafer according to this invention can provide another silicon wafer as described above.

DETAILED DESCRIPTION

Figure 1:
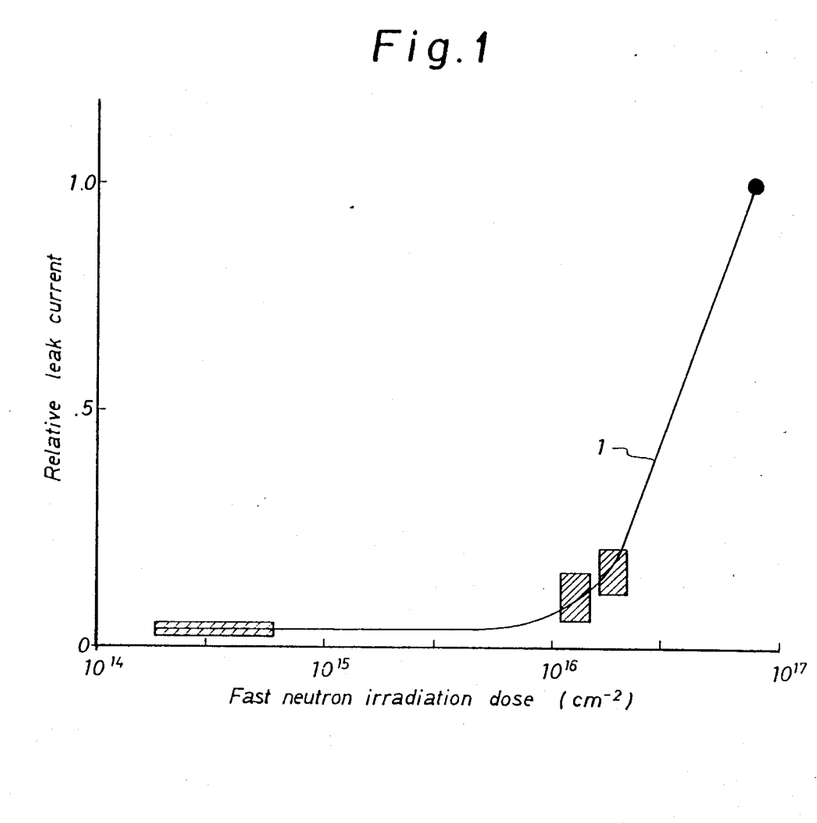
FIG. 1 is a graph illustrating a relationship between the irradiation dose of fast neutrons and the relative leak current in a test device.

In order to attain the means for solving the first Problem as described above, the present inventors manufactured single silicon crystals of low oxygen contents in a broad range, i.e., from $1 \times 10^{17}$ to $8 \times 10^{17}$ atoms/cm$^3$ of oxygen by the T-MCZ method, and conducted neutron irradiation to these various single silicon crystals so as to obtain the doped amount of phosphor corresponding to 12 Ω·cm to 100 Ω·cm by using nuclear reactors having thermal neutron/ fast neutron ratio about from 6 to 5000. Then, after confirming that the radioactivity was reduced to less than natural radioactivity, wafers and test pieces are manufactured. Then, after applying heat treatment to test pieces under various combined conditions of heat treatment at a temperature from 400° C. to 1200° C. and for a treating time from 5 to 120 minutes to determine the heat treatment temperature for the test pieces where the electric resistivity is settled, the wafers are heat-treated at the determined temperature. Test devices according to NBS standards are made on the wafers and then the leak current of the devices are measured. The result is shown in FIG. 1 by curve 1. In FIG. 1, the abscissa represents the fast neutron irradiation dose and the ordinate represents the leak current as a relative leak current assuming the leak current of the test device as 1 at the fast neutron irradiation dose of $6.8 \times 10^{16}$/cm$^2$.

As can be seen from FIG. 1, if the fast neutron irradiation dose is set to lower than $3 \times 10^{16}$/cm$^2$, the relative leak current in the test device can be reduced to less than 0.5. It is found that the relative leak current of the device can be decreased extremely by reducing the fast neutron irradiation dose preferably to less than $2 \times 10^{16}$/cm$^2$. Each of the neutron irradiation ranges shown by the hatched line in FIG. 1 means the result of the experiment of varying the oxygen content while fixing the fast neutron irradiation dose to a constant value. From the result, it is found that reduction in the fast neutron irradiation dose is more effective than the decrease of the oxygen content for lowering the relative leak current.

Impingement of fast neutrons on silicon atoms produces interstitial silicon atoms and causes binding between the interstitial silicon atoms and interstitial oxygen atoms, and it is confirmed by the infrared spectroscopy that the defects caused by the binding, that is, the A center defects are eliminated by the heat treatment at about 500° C.

Although it has been known that the electric resistivity and the carrier life time of single silicon crystals suffering from damage such as A center defects by the fast neutron irradiation are settled by the heat treatment at about 800° C. to 1000° C., it is not apparent whether this can be regarded as the complete recovery of crystals. In fact, when the present inventors measures the transmittance of near infrared rays near the absorption edge of silicon single crystals, although the electric resistivity and the carrier life time of silicon wafers applied with fast neutron irradiation at a dose of greater than about $7 \times 10^{16}$/cm$^2$ are settled by the heat treatment at 900° C. for about 20 minutes, the transmittance is extremely lowered as compared with that under other irradiation conditions. While such a transmittance reduction is supposed to be caused also by the defects in silicon, such a reduction in the transmittance is scarcely observed for the silicon wafers obtained by the method of producing silicon wafers according to this invention.

In order to attain the means for solving the second problems as described above, the present inventors manufactured single silicon crystals of low oxygen contents in a broad range, that is, from $1 \times 10^{17}$ to $8 \times 17^{17}$ atoms/cm$^3$ of oxygen by way of the T-MCZ method and conducted neutron irradiation to these various single silicon crystals by using nuclear reactors having thermal neutron/fast neutron ratio about from 6 to 5000. Then, after confirming that the radioactivity is lowered than that of natural radioactivity, wafers and test pieces are manufactured. Then, after conducting heat treatment for the test pieces under various combined condition of heat treatment at a temperature from 400° C. to 1200° C. and heat treatment for a time from 5 to 120 minutes to determine the temperature for the heat treatment to the test pieces when the electric resistivity is settled, heat treatment is applied to the wafers at a temperature as determined above and test devices according to the NBS standards are made on the wafers.

Figure 2:
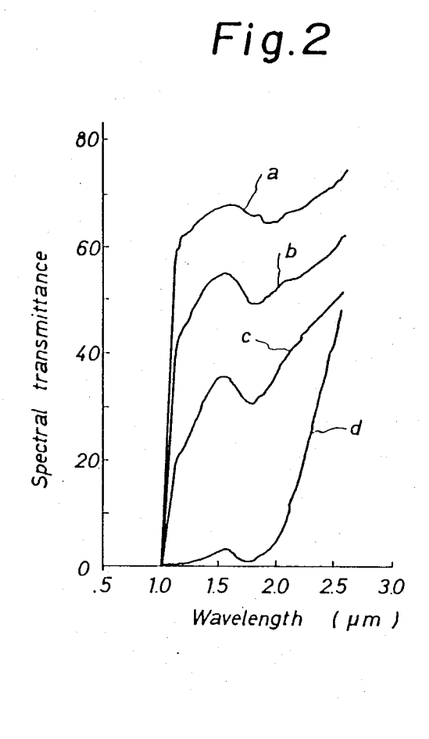
FIG. 2 is a graph illustrating the wavelength-spectral transmittance for single silicon crystals undergoing irradiation at different thermal neutron/fast neutron ratios but not applied with heat treatment.

In FIG. 2, a represents typical wavelength-spectral transmittance near the absorption edge of silicon for the wafer A manufactured from single silicon crystals irradiate in a first neutron irradiation nuclear reactor. b, c and d also show wavelength-spectral transmittance of wafers B, C, D corresponding to second, third, fourth neutron irradiation nuclear reactors.

Figure 3:
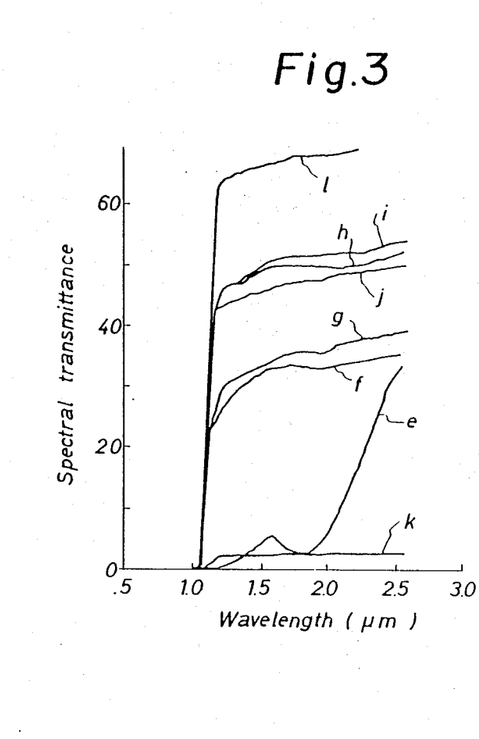
FIG. 3 is a graph illustrating the wavelength-spectral transmittance for specimen D corresponding to d in FIG. 2 in the case of applying heat treatment.

FIG. 3 shows a trend of the wavelength-spectral transmittance for each of the measuring wafers with or without the NTD process and under varying conditions for heat treatment. The NTD process is applied in the fourth neutron irradiation nuclear reactor in FIG. 2. In FIG. 3, the trend of the wavelength-spectral transmittance are shown by each of the curves: e for wafer E applied with NTD and without heat treatment, f for wafer F applied with NTD and heat treatment at 400° C. $\times$ 60 min, g for wafer G applied with NTD and heat treatment at 500° C. $\times$ 60 min, h for wafer H applied with NTD and heat treatment at 600° C. $\times$ 60 min, i for wafer I applied with NTD and heat treatment at 700° C. $\times$ 20 min, j for wafer J applied with NTD and heat treatment at 800° C. $\times$ 10 min, k for wafer K applied with NTD and heat treatment at 900° C. $\times$ 10 min, and l for wafer L applied neither with NTD nor with heat treatment, respectively.

Figure 4A:
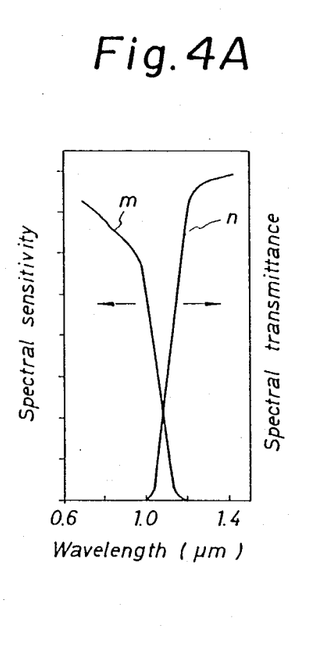
FIG. 4A is a graph illustrating the spectral sensitivity of a silicon photoreceiving element and the spectral transmittance of a silicon filter.
Figure 4B:
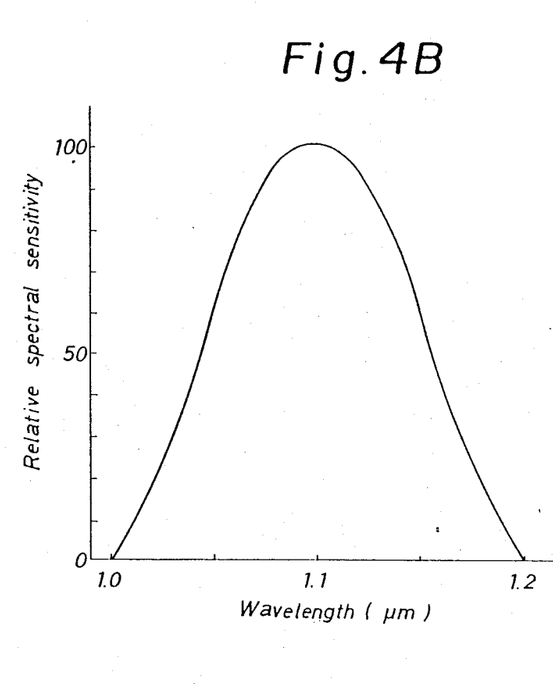
FIG. 4B is an explanatory view for the relative spectral sensitivity in the case of detecting the transmitted light through the silicon filter by the silicon photoreceiving element.

Explanation will be made to a device for measuring the transmission intensity. In FIG. 4A, curve m represents the spectral sensitivity of a silicon photoreceiving device with no filter, while curve n represents the special transmittance of a silicon filter with less impurity content. Each of the curves is indicated on an arbitrary scale. In accordance with the graph, if the light transmitting the silicon crystals is received by the silicon photoreceiving device, a relative spectral sensitivity distribution is convexed uniformly such that each spectral sensitivity at the wavelength of 1.0 μm and 1.2 μm is 0 assuming the sensitivity at a wavelength of 1.1 μm as 100 as shown in FIG. 4B. That is, when the photoreceiving intensity is measured by using a silicon photodetecting device with no filter, the amount of the transmitted light near the substantially linear absorption edge at the wavelength of about 1.1 μm of the curve shown in a FIGS. 2 and 3 can be measured approximately in a proportional relationship.

Figure 5:
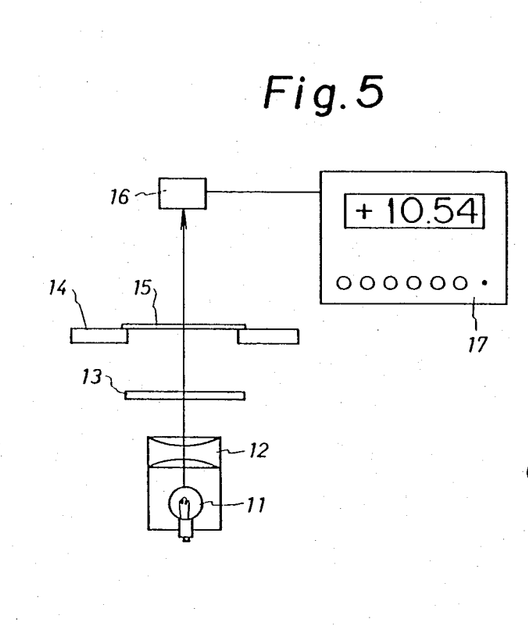
FIG. 5 is a schematic view for a preferred embodiment of a selection device according to this invention.

FIG. 5 is a schematic view for one embodiment of a device measuring the transmission intensity as described above. In FIG. 5, light emitted from an incandescent light source 11 is collected by a condenser lens 12, and applied by way of a silicon filter 13 with less dopant of 2 mm thickness and a measuring silicon wafer 15 placed on a mounting plate 14 to a silicon photodetecting device 16 with no filter, for example, a silicon solar cell. In this way, a voltage in proportion with the amount of transmitted light through the measuring silicon wafer is generated in the silicon photodetecting device 16 and the voltage can be measured by a measuring and indication device 17. Further, by measuring the reference amount of transmitted light through a reference silicon wafer instead of the measuring silicon water 15 by the device as shown in FIG. 5 and determining the ratio of the amount of the transmitted light through the measuring silicon wafer relative to the amount of the reference transmitted light, a relative transmission intensity can be obtained.

Instead of the incandescent light source described above, it is possible to use near infrared rays passing through an interference filter of wavelength at 1.1 μm and, preferably, a band pass interference filter of wavelength at 1.1 μm±0.0075 μm and, further, a prism type spectralyzer or diffraction grating type spectralyzer may be used instead of the interference filter. Further, YAG laser beams may be used instead of the infrared rays and laser beams from a laser diode slightly deviated from 1.0 μm to 1.2 μm may be used. Any of photodetecting devices may be used in this case with no particular restrictions so long as they have sensitivity to wavelength at about 1.1 μm.

Figure 6:
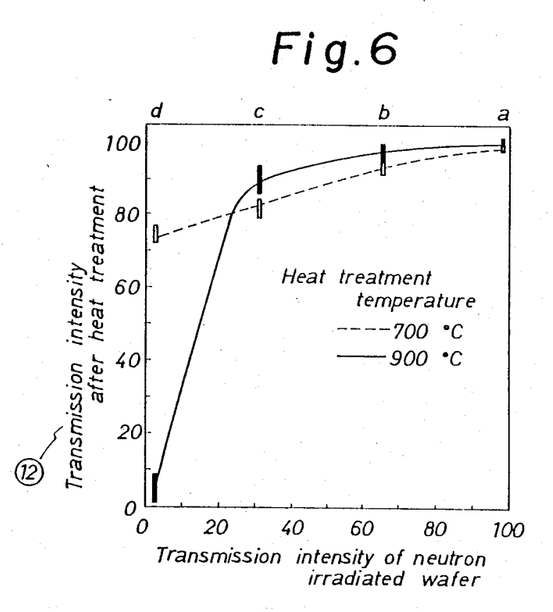
FIG. 6 is a graph showing the result of measurement by the selection device according to this invention for wafers not applied with neutron irradiation and heat treatment.

After applying heat treatment at 700° C. and 900° C. for four kinds of specimens A, B, C, D at an explanation in Fig. 2 and measuring the relative transmission intensity by the transmission intensity measuring device, the results of FIG. 6 showing the respective relative transmission intensity can be obtained. In FIG. 6, although the transmission intensity after heat treatment is increased substantially in parallel with the recovery of the electric resistivity for the specimens other than D, the transmission intensity is remarkably reduced at 900° C. for the specimen D although the resistivity is recovered.

Figures 7, 8:
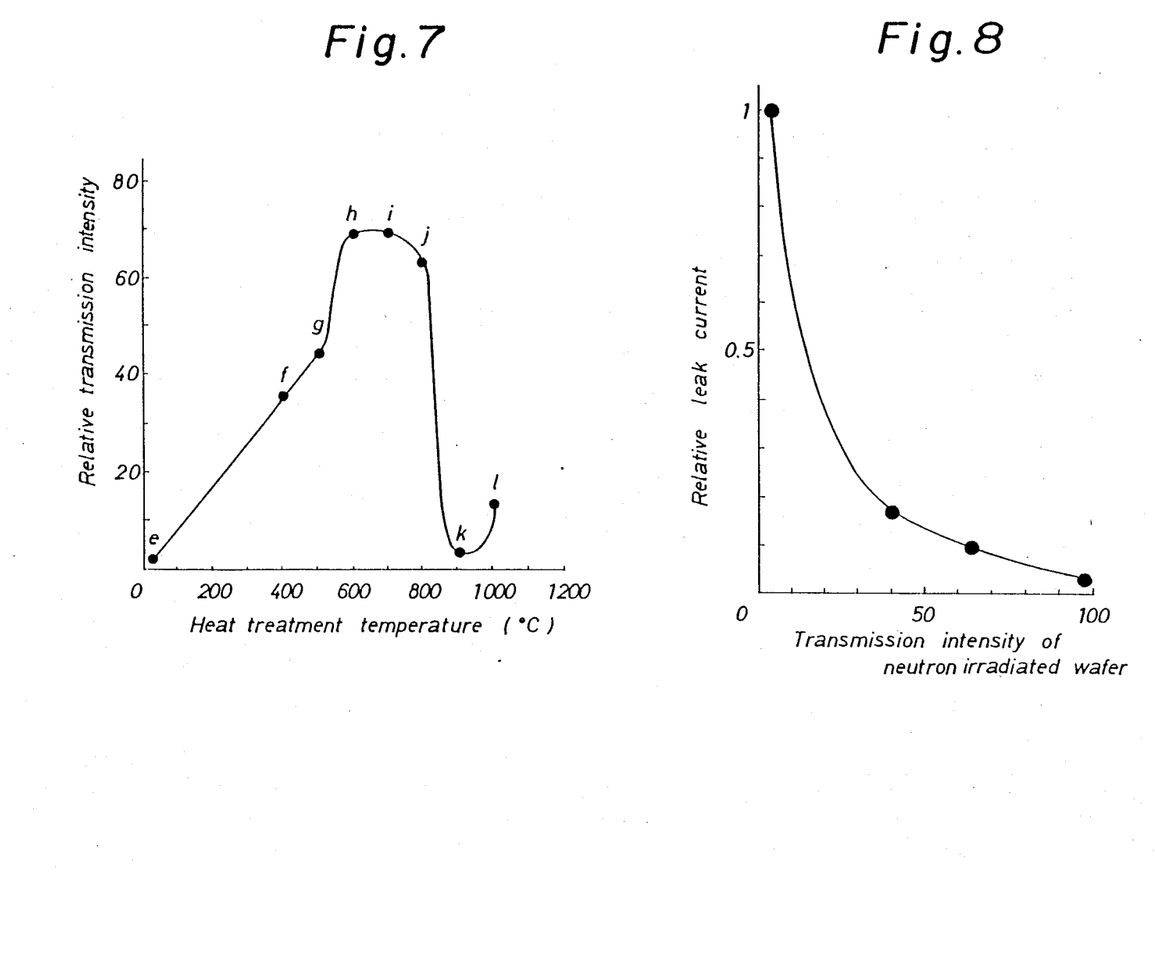
FIG. 7 is a graph showing the result of measurement by the selection device according to this invention for a wafer D applied with heat treatment corrsponding to d in FIG. 2.
FIG. 8 is a graph showing a relationship between the near infrared rays and the relative leak current in wafers with neither neutron irradiation nor heat treatment.

Further, relative transmission intensity for 8 kinds of specimens shown in FIG. 3 were measured by the transmission intensity measuring device to obtain the results shown in FIG. 7. In FIG. 7, e to l correspond to the symbols in FIG. 3. That is, although the recovery of the resistivity begins by the heat treatment at a temperature of 800° C. and it is recovered at 910° C., the relative transmission intensity is remarkably reduced and recovery for the relative transmission intensity begins again at a temperature higher than 1000° C. This may be considered that defects resulted by the binding with oxygen content due to the irradiation of extremely fast neutrons cause some further defects by a heat treatment at a higher temperature than 800° C.

When the relative transmission intensity is measured for each of the specimens E to L in the same way while varying the oxygen content, reduction in the relative transmission intensity is also resulted at 900° C. although there is a difference by about three times in the variation coefficient.

FIG. 8 shows a relationship between the result of measurement for the relative transmission intensity for each of the specimens A to D of FIG. 2 in the transmission intensity measuring device of FIG. 5 and the result of measurement for the leak current for the test device manufactured according to NBS standards after applying heat treatment for the recovery of the electric resistivity.

I FIG. 8, the abscissa represents the transmission intensity before heat treatment and the ordinate represents the relative lea current in average values. As can be seen from the graph, if the transmission intensity of the wafer before heat treatment applied with NTD is measured nd wafers having transmission intensity of at least greater than 30 % are selected, the wafer can be regarded as silicon wafers with less relative leak current after the heat treatment and, accordingly, silicon wafers having no favorable characteristics can be checked before th heat treatment. By the way, silicon wafers with low leak current can be used for high voltage withstanding and high electric power devices.

Measurement conducted to the transmission intensity in this invention is not restricted only to the wafers before heat treatment, but similar result can also be obtained by measuring the transmission intensity of wafers applied with NTD and heat treatment. However, it is preferred to measure the transmission intensity before heat treatment in view of the cost.

Explanation will be made to another embodiment of the transmission intensity measuring device while referring to FIGS. 9 through 12. In these FIGURES, constituent elements similar to those in FIG. 5 carry the same reference numerals.

Figure 9:
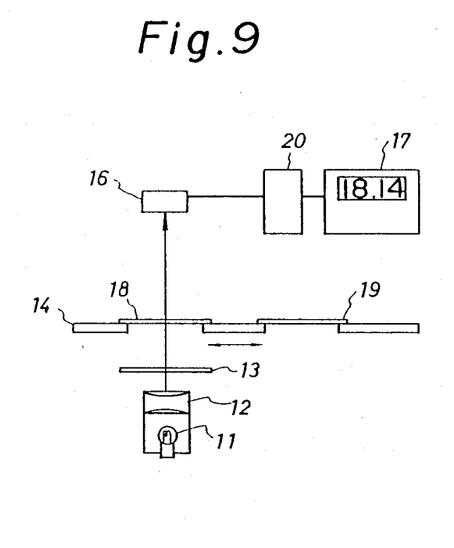
FIG. 9 is a schematic view illustrating another embodiment of the selection device according to this invention.

In FIG. 9, wafer measuring and checking operations can be conducted with ease by forming circular holes to a movable mounting plate 14, placing thereon reference wafer 18 and measuring wafer 19 to b compared and alternately measuring and comparing them. Reference numeral 20 denotes a device for storing the measured values for comparison, by which the operation efficiency can be improved. Reference numeral 17 depotes a indicator of the measured values. A device for automatically supplying the measuring wafer 19 to the mounting plate 14 or a device for automatically storing the measuring wafer 19 from above the mounting plate 14 to a vessel may be provided additionally to the device shown in FIG. 9, by which the working efficiency can be improved and damage or contamination to the wafers can be reduced.

Figure 10:
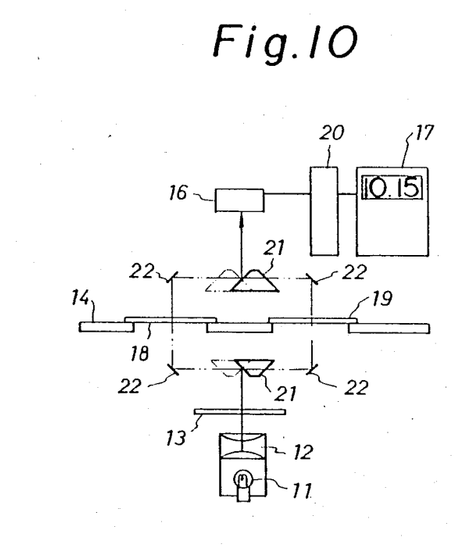
FIG. 10 is a schematic view illustrating a further embodiment of the selection device according to this invention.

As shown in FIG. 10, when a movable mirror 21 and a stationary mirror 22 are mounted such that the incident light and transmitted light can be switched under synchronization to the reference wafer 18 and the measuring wafer 19, moving means for the mounting plate 14 can be saved.

Figure 11:
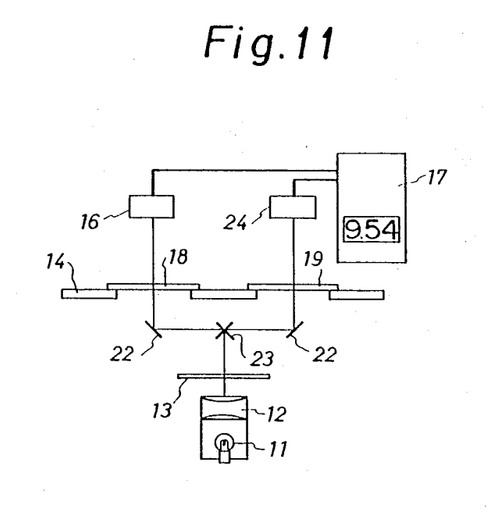
FIG. 11 is a schematic view for a still further embodiment of the selection device according to this invention.

Further, as shown in FIG. 11, light coming from the incandescent light source 11 may be divided by using a half mirror 23 and a stationary mirror 22 and applied to the reference wafer 18 and the measuring wafer 19 for measuring the transmitted light therefrom by photodetecting devices 16, 24 of an identical design, whereby the mounting plate 14 and the moving portion such as a movable mirror can be saved to provide an advantage in view of the operation efficiency.

Further, in the transmission intensity measuring device shown in FIG. 5, when a silicon video converter is used as the measuring device and the measurement is conducted by circular polarization, it is possible to recognize the defect distribution in the measuring wafer and slips or the likes can also be measured as well, thereby enabling to eliminate the risk of erroneous measurement due to lattice defects such as slips.

Further, by the present inventors carried out the following examination for overcoming the third problem described before. When a silicon wafer of an oxygen content higher than about $0.5 \times 10^{17}$ atoms/cm$^3$ and irradiated by fast neutrons at a dose of greater than $1 \times 10^{16}$/cm$^2$ is heated to 900° C., the infrared absorption of the silicon wafer at a wavelength of 1.1 to 2 μm is increased. This phenomenon is considered to be attributable to the scattering of particle regions each having a diameter equal to the wavelength of the incident infrared rays and including numerous fine angular deviation. It is apparent from the electric microscopic observation for the silicon wafers as described above that particle regions each having less than about 0.1 to 10 μm of diameter and less than about 0.1° of fine angular deviation are generated by more than $1 \times 10^3$/cm$^3$ and it is confirmed that the wafer is slightly deformed at a boundary of particle regions. By the way, the particle regions have a gettering effect and, according to the foregoing observation, it is confirmed that they are eliminated after more than one hour. Accordingly, gettering effect to impurities, damages upon surface fabrication, etc. can be improved at the initial stage of the device manufacturing step that gives a significant effect on the device characteristics, which is different from the case where they do not disappear during device manufacturing step and other gettering function carriers grow greatly due to heat treatment and form slips or large deposits to hinder the device characteristics.

In order to confirm the phenomenon as described above, measurement is conducted for the effect in the case of irradiating fast neutrons of about $5 \times 10^{16}$/cm$^2$ for silicon wafers prepared from an identical rod, and the results are shown in Table 1.

Notes (1) to (4) to Table 1 are as follows; Note (1) Fast neutron irradiation dose of about $5 \times 10^{16}$/cm$^2$.

(2) Values converted by the IR absorption measuring method in accordance with ASTM Standards, 1981 edition.

(3) In fabrication A, epitaxial growing is conducted SiCl$_3$H to a silicon wafer applied with heat treatment at 900° C. for 10 minutes after the irradiation of fast neutrons. In fabrication B, slight amount of Fe contamination is caused to the surface of a silicon wafer applied with fabrication A.

(4) NTD shows a silicon wafer applied with neutron irradiation transmutation doping.

In Table 1, all of silicon wafers in Data No. 1 to 32 are made from single silicon crystals pulled up under transverse magnetic fields.

From the results, it can be seen that the fast neutron-irradiated silicon wafers have favorable IG-gettering property. By the way, if the fast neutron irradiation dose is greater than $5 \times 10^{16}$/cm$^2$, there is no difference in the IG gettering property depending on the difference of the oxygen content in silicon wafers. Also, there is no difference in the IG-gettering property in view of the difference for the resistivity of the silicon wafers within a range from 5 to 20 Ω·cm in the B, As dopant, and from 30 to 50 Ω·cm in the P dopant.

Figure 12:
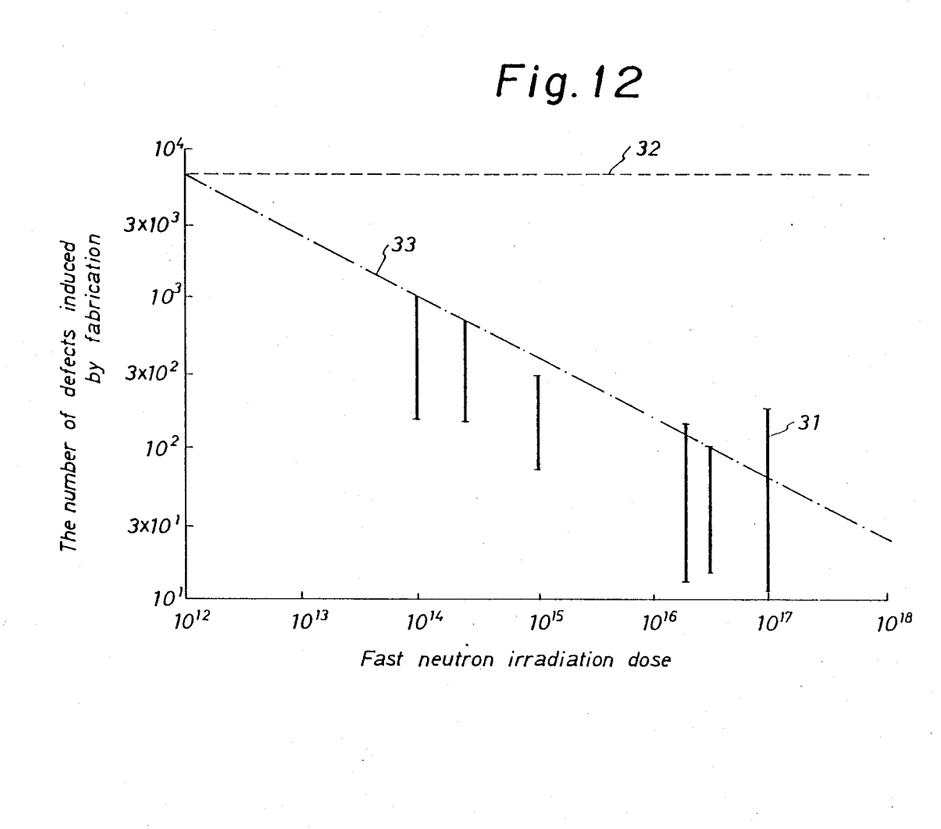
FIG. 12 is a graph showing the effect obtained by another method of manufacturing a silicon wafer according to this invention.

FIG. 12 is a graph representing the data measured for the number of laminate defects induced by fabrication by lines 31, while taking notice of the laminate defects induced by fabrication, that is, on the basis that if the laminate defects induced by fabrication are produced or not at the epitaxially grown surface after the epitaxial growing step and, if produced, based on the amount of production as the criterion for the judgement, while varying the irradiation dose of fast neutrons for 6 levels i.e., between $1 \times 10^{14}$/cm$^2$ and $1 \times 10^{17}$/cm$^2$ relative to B 20 Ω·cm doped Si and P 50 Ω·cm NTD Si. In FIG. 12, the average value ($7 \times 10^3$/cm$^2$) for the case of not irradiating fast neutrons is represented by the dotted line 32. If the upper limit values for the measured data in the respective fast neutron irradiation doses are extended as shown by the dotted chain line 33 in FIG. 12 the dotted chain line passes a point substantially at $10^4$/cm$^2$ of the number of fabrication-induced defects at the fast neutron irradiation dose of $1 \times 10^{12}$/cm$^2$. It is therefore considered that the number of laminate defects induced by fabrication can be decreased as compared with the case of not irradiating fast neutrons and, accordingly, IG-gettering property can be improved if the fast neutron irradiation dose is greater than $1 \times 10^{12}$/cm$^2$.

Six variations between $1 \times 10^{14}$/cm$^2$ to $1 \times 10^{17}$/cm$^2$ for the fast neutron irradiation dose as described above were obtained by using nuclear factors as shown in Table 2.

By the way, as can be seen from Table 2, the thermal neutron/fast neutron ratio of nuclear reactors used for the fast neutron irradiation ranges about from 6 to 3000 and the fast neutron flux density ranges about from $2 \times 10^9$/cm$^2$·s to $1 \times 10^{13}$/cm$^2$·s. Accordingly, the time required for the fast neutron irradiation, for example, of $1 \times 10^{14}$/cm$^2$ is from about 10 sec to 12 hr, while the time required for the fast neutron irradiation of $1 \times 10^{16}$/cm$^2$ is from about 17 min to 1390 hr. That is, by selecting an adequate neutron reactor depending on the required fast neutron dose, necessary fast neutron irradiation dose can be applied in a sufficiently short period of time and at a high accuracy.

Upon irradiation of fast neutrons, it has to be noted that thermal neutrons are also irradiated together with the fast neutrons. If the thermal neutrons are irradiated, since since Si$^{30}$ is transmuted into P$^{31}$, compensation of B dopant with resultant P occurs to increase the resistance in B-doped Si, while resistance is reduced due to resultant P in As-doped Si. These changes are smaller as the original Si resistance is lower and, in a case where the resistance is lower than 10 Ω·cm, the foregoing change is less than 10% under the fast neutron irradiation in any of nuclear reactors. In the case where the original resistance is higher than 10 Ω·cm, compensation corresponding to the thermal neutron irradiation dose is necessary.

Reduction in the amount of compensation due to the fast neutron irradiation and increase of the effect due to the fast neutron irradiation can be attained by using a nuclear reactor in which the thermal neutron/fast neutron ratio is smaller, by which the fast neutron irradiation time can be shortened to provide a advantage in view of the improvement in the productivity. Based on the experiment as described above, those nuclear reactors with the thermal neutron/fast neutron ratio less than 30 are preferred. In those experiments, the ratio of thermal neutron/fast neutron may be controlled by any well-known method. For example, as will be appreciated by those skilled in the art, the thermal neutron/fast neutron ratio may be controlled by use of a Canadian-type reactor employing heavy-water/carbon structure suitable for a high ratio such as between 3000 to 5000, an English-type reactor employing heavy-water structure suitable for median ratio such as below 50, an American-type reactor employing light-water/carbon structure suitable for median ratio such as below 25, and a French-type reactor employing light-water structure suitable for a low ratio such as between 6 and 10, wherein further control of the ratio can be performed, for example, by changing the geometry of the wafer in the reactor or/and providing a neutron-screen means around the wafer.

Referring to the usefulness of the heat treatment before the epitaxial growing step to silicon wafers prepared by another method of manufacturing the silicon wafer according to this invention, no difference could be found between the silicon wafers applied with heat treatment and silicon wafers not applied with heat treatment as the result of an experiment. The reason is that there is an inevitable limit for the shortening of the time from the start of heating after a silicon wafer has been charged to an epitaxial growing furnace till the start for the epitaxial growing seep and, accordingly, the defects due to the heat treatment after the fast neutron irradiation are generated at an identical level in both of the cases during this time. Accordingly, in practical point of view, there are no problems when the wafers prepared by machining after the fast neutron irradiation are directly applied to the epitaxial growing step, while omitting the heat treatment before the epitaxial growing step.

TABLE 1

| Data No. | Dopant (added impurity) | Resistivity $\Omega$cm | Oxygen content[2] ($\times 10^{17}$/cm$^3$) | Fast neutron irradiation[1] | Type of fabrication[3] | The number of laminate defects induced by fabrication 1/cm$^3$ | Defects induced by contamination | Remarks |
|---|---|---|---|---|---|---|---|---|
| 1 | B | 5 | 2-3 | None | B | not less than $10^3$ | remarkable | |
| 2 | ↓ | ↓ | 6-8 | ↓ | ↓ | ↓ | ↓ | |
| 3 | ↓ | ↓ | 13-15 | ↓ | ↓ | less than $10^3$ | ↓ | |
| 4 | ↓ | ↓ | 2-3 | Applied | ↓ | not greater than $10^2$ | little | |
| 5 | ↓ | ↓ | 6-8 | ↓ | ↓ | about $10^2$ | ↓ | |
| 6 | ↓ | ↓ | 13-15 | ↓ | ↓ | less than $10^2$ | ↓ | |
| 7 | ↓ | 20 | 2-3 | None | A | not less than $10^3$ | remarkable | |
| 8 | ↓ | ↓ | 6-8 | ↓ | ↓ | ↓ | ↓ | |
| 9 | ↓ | ↓ | 13-15 | ↓ | ↓ | less than $10^3$ | ↓ | |
| 10 | ↓ | ↓ | 2-3 | Applied | ↓ | not greater than $10^2$ | no | |
| 11 | ↓ | ↓ | 6-8 | ↓ | ↓ | less than $10^2$ | ↓ | |
| 12 | ↓ | ↓ | 13-15 | ↓ | ↓ | ↓ | ↓ | |
| 13 | As | 5 | 2-3 | None | B | less than $10^3$ | remarkable | |
| 14 | ↓ | ↓ | 6-8 | ↓ | ↓ | ↓ | ↓ | |
| 15 | ↓ | ↓ | 13-15 | ↓ | ↓ | ↓ | ↓ | |
| 16 | ↓ | ↓ | 2-3 | Applied | ↓ | not greater than $10^2$ | little | |
| 17 | ↓ | ↓ | 6-8 | ↓ | ↓ | ↓ | ↓ | |
| 18 | ↓ | ↓ | 13-15 | ↓ | ↓ | ↓ | ↓ | |
| 19 | ↓ | 20 | 2-3 | None | A | in excess of $10^3$ | remarkable | |
| 20 | ↓ | ↓ | 6-8 | ↓ | ↓ | ↓ | ↓ | |
| 21 | ↓ | ↓ | 13-15 | ↓ | ↓ | ↓ | ↓ | |
| 22 | ↓ | ↓ | 2-3 | Applied | ↓ | not greater than $3 \times 10^3$ | little | |
| 23 | ↓ | ↓ | 6-8 | ↓ | ↓ | ↓ | ↓ | |
| 24 | ↓ | ↓ | 13-15 | ↓ | ↓ | not greater than $1 \times 10^3$ | ↓ | |
| 25 | P | 30 | 1-3 | None | A | in excess of $10^3$ | remarkable | |
| 26 | ↓ | ↓ | 6-8 | ↓ | ↓ | ↓ | ↓ | |
| 27 | ↓ | ↓ | 1-3 | Applied | ↓ | not greater than $10^2$ | no | NTD[4] |
| 28 | ↓ | ↓ | 6-8 | ↓ | ↓ | ↓ | ↓ | ↓ |
| 29 | ↓ | 50 | 1-3 | None | B | in excess of $10^3$ | remarkable | |
| 30 | ↓ | ↓ | 6-8 | ↓ | ↓ | ↓ | ↓ | |
| 31 | ↓ | ↓ | 1-3 | Applied | ↓ | not greater than $10^2$ | no | NTD |
| 32 | ↓ | ↓ | 6-8 | ↓ | ↓ | ↓ | ↓ | ↓ |

TABLE 2

| | Nuclear reactor | | | | |
|---|---|---|---|---|---|
| | A | B | C | D | E |
| Fast neutron flux density ($\times 10^{11}$/cm$^2 \cdot$ s) | 95.0 | 59.0 | 0.680 | 20.0 | 0.0237 |
| Thermal neutron flux density ($\times 10^{13}$/cm$^2 \cdot$ s) | 5.70 | 5.90 | 0.170 | 6.01 | 0.71 |
| Thermal neutron flux density/fast neutron flux density | 6 | 10 | 25 | 30 | 3,000 |
| Time required for fast neutron irradiation $1 \times 10^{13}$ | 1.05 sec | 1.69 sec | 2.45 min | 5 sec | 1.21 hr |
| Time required for fast neutron irradiation $1 \times 10^{14}$ | 10.5 sec | 16.9 sec | 24.5 min | 50 sec | 12.1 hr |
| Time required for fast neutron irradiation | 1.75 min | 2.81 min | 4.08 hr | 8.3 min | 5.75 day |

TABLE 2-continued

| | Nuclear reactor | | | | |
|---|---|---|---|---|---|
| | A | B | C | D | E |
| $1 \times 10^{15}$ | | | | | |
| Time required for fast neutron irradiation $1 \times 10^{16}$ | 17.5 min | 28.1 min | 40.8 hr | 83 min | 57.5 day |

What is claimed is:

1. A method of producing a P-doped silicon wafer, comprising the steps of:

preparing a single silicon crystal made by the MCZ method and having an oxygen content within a range from $5 \times 10^{16}$ atoms/cm$^3$ to $10 \times 10^{17}$ atoms/cm$^3$, and doping phosphor into said crystal by transmuting isotope Si$^{30}$ contained in said crystal into P$^{31}$, under a neutron irradiation to said crystal at an irradiation dose of fast neutrons less than $3 \times 10^{16}$/cm$^2$.

2. A method of producing a silicon wafer having a low density of A center type defects for use in epitaxial growing, comprising the steps of:

preparing a silicon wafer having an oxygen content of not less than $5 \times 10^{16}$ atoms/cm$^3$, and irradiating fast neutrons to said wafer at a dose of not less than $1 \times 10^{12}$/cm$^2$ by a nuclear reactor having a thermal neutron/fast neutron ratio of not greater than 30.

* * * * *